United States Patent
Wang et al.

(10) Patent No.: US 8,860,006 B2
(45) Date of Patent: Oct. 14, 2014

(54) SPIN TRANSISTOR HAVING MULTIFERROIC GATE DIELECTRIC

(75) Inventors: Kang-Lung Wang, Santa Monica, CA (US); Ajey Poovannummoottil, Marina Del Rey, CA (US); Faxian Xiu, Los Angeles, CA (US)

(73) Assignee: The Regents of the University of California, Oakland, CA (US)

( * ) Notice: Subject to any disclaimer, the term of this patent is extended or adjusted under 35 U.S.C. 154(b) by 522 days.

(21) Appl. No.: 13/071,934

(22) Filed: Mar. 25, 2011

(65) Prior Publication Data
US 2011/0233524 A1 Sep. 29, 2011

Related U.S. Application Data

(60) Provisional application No. 61/318,087, filed on Mar. 26, 2010.

(51) Int. Cl.
| | |
|---|---|
| *H01L 43/00* | (2006.01) |
| *B82Y 10/00* | (2011.01) |
| *H01L 29/66* | (2006.01) |
| *H01L 29/51* | (2006.01) |
| *H01L 29/12* | (2006.01) |
| *H01L 29/423* | (2006.01) |
| *H01L 29/06* | (2006.01) |

(52) U.S. Cl.
CPC ............. *H01L 29/517* (2013.01); *B82Y 10/00* (2013.01); *H01L 29/66984* (2013.01); *H01L 29/122* (2013.01); *H01L 29/42356* (2013.01); *H01L 29/0673* (2013.01); *Y10S 977/935* (2013.01)
USPC ....... 257/39; 257/295; 257/E43.001; 977/935

(58) Field of Classification Search
None
See application file for complete search history.

(56) References Cited

U.S. PATENT DOCUMENTS

| | | | | |
|---|---|---|---|---|
| 3,770,395 | A | * | 11/1973 | Sawatzky et al. ............. 428/641 |
| 6,882,051 | B2 | * | 4/2005 | Majumdar et al. ............ 257/746 |
| 2004/0016968 | A1 | * | 1/2004 | Coronel et al. ................ 257/347 |
| 2004/0182307 | A1 | * | 9/2004 | Lim et al. ........................... 117/2 |
| 2009/0050949 | A1 | * | 2/2009 | Maruyama et al. ........... 257/295 |
| 2010/0271112 | A1 | * | 10/2010 | Hong et al. .................... 327/534 |

FOREIGN PATENT DOCUMENTS

WO WO 2009011956 A2 * 1/2009 ............. H01L 29/96

OTHER PUBLICATIONS

"Advances in Wide Bandgap Materials for Semiconductor Spintronics," by "Pearson," Materials Science and Engineering R 40 (2003), pp. 137-168.*

Awschalom, D.D. et al., "Spintronics," Scientific American vol. 286 No. 6, Jun. 2002, pp. 67-73.

(Continued)

*Primary Examiner* — Hrayr A Sayadian
(74) *Attorney, Agent, or Firm* — Withrow & Terranova, P.L.L.C.

(57) ABSTRACT

A carrier-mediated magnetic phase change spin transistor is disclosed. In general, the spin transistor includes a Dilute Magnetic Semiconductor (DMS) channel and a gate stack formed on the DMS channel. The gate stack includes a multiferroic gate dielectric on the DMS channel, and a gate contact on a surface of the multiferroic gate dielectric opposite the DMS channel. The multiferroic gate dielectric is formed of a multiferroic material that exhibits a cross-coupling between magnetic and electric orders (i.e., magnetoelectric coupling), which in one embodiment is $BiFeO_3$ (BFO). As a result, the multiferroic material layer enables an electrically modulated magnetic exchange bias that enhances paramagnetic to ferromagnetic switching of the DMS channel. The DMS channel is formed of a DMS material, which in one embodiment is Manganese Germanium (MnGe). In one embodiment, the DMS channel is a nanoscale DMS channel.

23 Claims, 5 Drawing Sheets

(56) References Cited

OTHER PUBLICATIONS

Chu, Y. et al., "Electric-field control of local ferromagnetism using a magnetoelectric multiferroic," Nature Materials, vol. 7 No. 6, Jun. 2008, pp. 478-482.
Datta, S. et al., "Electronic analog of the electro-optic modulator," Applied Physics Letters, vol. 56, Feb. 12, 1990, pp. 665-667.
Itoh, K. et al., "Topology and spin alignment in model compounds of organic ferro- and ferri-magnets," Journal of Molecular Electronics, vol. 4, Feb. 1988, pp. 181-186.
Johnson, M., "Bipolar Spin Switch," Science vol. 260, Apr. 1993, pp. 320-323.
Liu, G. et al., "Magnetic resonance hybridization and optical activity of microwaves in a chiral metamaterial," Applied Physics Letters, vol. 92, Mar. 31, 2008, pp. 131111-1-131111-3.
Nikonov, D.E. et al., "Spin gain transistor in ferromagnetic semiconductors-the semiconductor Bloch-equations approach," IEEE Transactions on Nanotechnology, vol. 4 No. 2, Mar. 2005, pp. 206-214.
Sarma, S.D., "Spintronics: A new class of device based on the quantum of electron spin, rather than on charge, may yield the next generation," American Scientist, vol. 89 No. 6, Dec. 2001, pp. 516-523.
Schmidt, R. et al., "Impedance spectroscopy of epitaxial multiferroic thin films," Physical Review B, vol. 75, Jun. 14, 2007, 24 pages.
Van Aken, B. et al., "The origin of ferroelectricity in magnetoelectric $YMnO_3$," Nature Materials, vol. 3 No. 3, Mar. 2004, pp. 164-170.
Wolf, S. A. et al., "Spintronics: A Spin-Based Electronics Vision for the Future," Science, vol. 294, Nov. 16, 2001, pp. 1488-1495.
Xui, F. et al., "Electronic Field Controlled Ferromagnetism in High Curie Temperature $Mn0.05Ge0.95$ Quantum Dots," Nature Materials 9, Mar. 7, 2010, pp. 337-344.
Xui, F. et al., "Room-Temperature Electronic Field Controlled Ferromagnetism in $Mn0.05Ge0.95$ Quantum Dots," ACS Nano, vol. 4 No. 8, Jul. 28, 2010, pp. 4948-4954.
Satoshi S. et al. "Spin MOSFETs as a Basis for Spintronics; ACM Transactions on Storage," vol. 2, No. 2, May 2006, pp. 197-219.
Lablanquie, P. et al., "Single photon multiionization of carbon-monoxide using synchrotron radiation," Journal of Molecular Structure, vol. 174, May 1988, pp. 141-146.

* cited by examiner

*FIG. 6B*    *FIG. 6C*

SPIN TRANSISTOR HAVING MULTIFERROIC GATE DIELECTRIC

RELATED APPLICATIONS

This application claims the benefit of provisional patent application Ser. No. 61/318,087, filed Mar. 26, 2010, the disclosure of which is hereby incorporated herein by reference in its entirety.

FIELD OF THE DISCLOSURE

The present disclosure relates to spin transistors and more particularly relates to carrier-mediated dilute magnetic semiconductor spin transistors.

BACKGROUND

Conventional Complementary Metal Oxide Semiconductor (CMOS) devices have been the primary electronic technology for over half a century. However, continuous scaling of conventional CMOS devices has resulted in challenges to reduce power dissipation and to lower variability. Spintronics, with its unique properties of magnetism in metallic and semiconductor nanostructures, has emerged as a possible technology for meeting these challenges.

Spintronic devices, namely spin transistors, operate based on the propagation of the spins of electrons rather than the transport of the charge of the electrons. More specifically, it has been shown that when current flows through a ferromagnetic layer into an ordinary metal, electrons retain their original spin polarization and, therefore, the polarized spin along a magnetic field can be transported just like charges. This concept has resulted in several attempts to fabricate spin transistors that exploit the spin dependent transport of charge carriers in order to yield a device with high spin current gain and high magnetic sensitivity. One such area of research is electric field control of ferromagnetism of Dilute Magnetic Semiconductors (DMSs).

Electric field control of ferromagnetism of DMS has the potential to realize spin Field Effect Transistors (s-FETs) and nonvolatile spin logic devices via carrier mediation. In general, the magnetic states of DMS materials could be controlled by an external electric field, in which the carrier density inside the DMS materials is altered. It has been observed that this transition from the paramagnetic to ferromagnetic state is a result of the accumulation of carriers (e.g., holes) in the DMS material in response to the application of the appropriate electric field much in the same manner as an accumulation mode of a Metal-Oxide-Semiconductor (MOS) capacitor. More specifically, the carriers interact with magnetic ions in the DMS material in such a manner that the DMS material transitions from its normal paramagnetic state to the ferromagnetic state when a large number of carriers are accumulated in the DMS material, and vice versa. This is referred to as the "carrier-mediated effect." However, spin transistors that operate based on the carrier-mediated effect, which are referred to herein as carrier-mediated paramagnetic-ferromagnetic (PF) s-FETs, are difficult to achieve for room temperature applications because of the challenges in obtaining, among other things, carrier induced ferromagnetism at room temperature.

Thus, there is a need for a carrier-mediated PF spin transistor for room temperature applications.

SUMMARY

A carrier-mediated magnetic phase change spin transistor is disclosed where the magnetic phase, or state, of the spin transistor changes between paramagnetic phase and ferromagnetic phase. In general, the spin transistor includes a Dilute Magnetic Semiconductor (DMS) channel and a gate stack formed on the DMS channel. The gate stack includes a multiferroic gate dielectric on the DMS channel, and a gate contact on a surface of the multiferroic gate dielectric opposite the DMS channel. The multiferroic gate dielectric is formed of a multiferroic material that exhibits a cross-coupling between magnetic and electric orders (i.e., magneto-electric coupling), which in one embodiment is $BiFeO_3$ (BFO). As a result, the multiferroic material layer enables an electrically modulated magnetic exchange bias that enhances paramagnetic to ferromagnetic switching of the DMS channel. The DMS channel is formed of a DMS material, which in one embodiment is Manganese Germanium (MnGe). In one embodiment, the DMS channel is a nanoscale DMS channel. More specifically, in one embodiment, the DMS channel is a DMS nanowire. In another embodiment, the DMS channel is a DMS nanodot. In yet another embodiment, the DMS channel is a DMS quantum well.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIGS. 6A through 6D illustrate a surround gate DMS carrier-mediated paramagnetic-ferromagnetic spin transistor according to another embodiment of the present disclosure.

DETAILED DESCRIPTION

Figure 1:
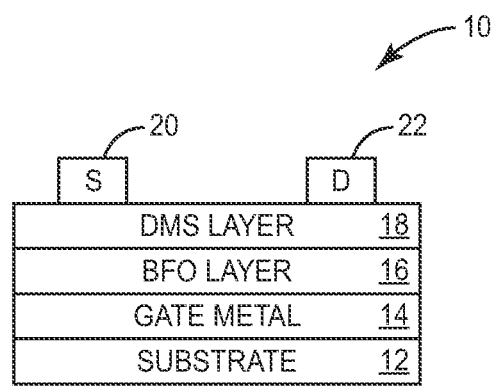
FIG. 1 illustrates a Dilute Magnetic Semiconductor (DMS) carrier-mediated paramagnetic-ferromagnetic spin transistor according to one embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure describes a Dilute Magnetic Semiconductor (DMS) carrier-mediated paramagnetic-ferromagnetic spin transistor that enhances paramagnetic to ferromagnetic switching by utilizing (1) electrically modulated magnetic exchange bias and, in some embodiments, (2) size and quantum confinement effects resulting from a nanoscale channel. The electrically modulated magnetic exchange bias and the nanoscale dimensions of the channel promote paramagnetic to ferromagnetic switching at room temperature. The efficient paramagnetic to ferromagnetic transition may result in an increase in on-state current while reducing off-state leakage current, which also improves the on-off ratio of the spin transistor. Further, the spin transistor disclosed herein induces non-voltage characteristics in spin polarized electrons/holes and can be used to, for example, build robust non-volatile memory.

FIG. 1 illustrates a DMS carrier mediated paramagnetic-ferromagnetic spin transistor 10 (hereinafter "spin transistor 10") according to one embodiment of the present disclosure. Specifically, the spin transistor 10 is a spin Field Effect Transistor (s-FET). As illustrated, the spin transistor 10 includes a substrate 12, a gate metal 14 on the surface of the substrate 12, a $BiFeO_3$ (BFO) layer 16 on the surface of the gate metal 14 opposite the substrate 12, a DMS layer 18 (also referred to herein as a DMS channel) on the surface of the BFO layer 16 opposite the gate metal 14, and source and drain contacts 20 and 22 on the surface of the DMS layer 18 opposite the BFO layer 16. In the preferred embodiment, the substrate 12 is a Silicon (Si) substrate, the gate metal 14 is $SrRuO_3$ (SRO), and the DMS layer 18 is Manganese Germanium (MnGe). However, the present disclosure is not limited thereto. In one embodiment, the source and drain contacts 20 and 22 are formed of Iron, but are not limited thereto. More specifically, the source and drain contacts 20 and 22 are preferably either ferromagnetic Schottky contacts, integrated spin valves, or spin tunnel junctions involving oxides such as, for example, magnesium oxide or aluminum oxide, but are not limited thereto. Other types of source and drain contacts suitable for carrier-mediated paramagnetic-ferromagnetic spin transistors may be used. As discussed below in detail, the DMS layer 18 is preferably implemented on a nanoscale. Even more preferably, the DMS layer 18 is preferably a DMS nanowire, a DMS nanodot, or a DMS quantum well.

The BFO layer 16 operates as a gate dielectric and, as such, may also be referred to herein as a BFO gate dielectric. BFO and other similar multiferroic materials are, by their nature, insulators and posses very high dielectric K values. In one embodiment, the BFO layer 16 has a dielectric K value in the range of 320±75. Notably, the dielectric K value of BFO depends on the growth methodology, especially in a process that can effectively reduce the oxygen vacancies and F2 complex defects. The high dielectric K value of the BFO layer 16 increases the carrier density in the channel region of the DMS layer 18 which is at the interface between the DMS layer 18 and the BFO layer 16 and thus enhances carrier-mediate ferromagnetism inside the DMS layer 18. Note that, in one embodiment, the BFO layer 16 is formed by a Pulsed Laser Deposition (PLD) process. However, other suitable physical and chemical vapor deposition processes may alternatively be used.

In addition, the BFO layer 16 operates to enhance the paramagnetic to ferromagnetic transition of the DMS layer 18 via electrically modulated magnetic exchange bias, or coupling. More specifically, the BFO layer 16 is formed of BFO, which is a multiferroic material. A multiferroic material is a material that simultaneously exhibits several ferroic orders, such as ferroelectricity and antiferromagnetism (AFM). BFO is a multiferroic material that exhibits a cross-coupling between magnetic and electric orders (i.e., magnetoelectric coupling). As a result of the magnetoelectric coupling, the BFO layer 16 enables an electrically modulated magnetic exchange bias, or coupling, that enhances the paramagnetic to ferromagnetic transition of the DMS layer 18. More specifically, when a turn-on voltage of the spin transistor 10 is applied to the gate metal 14, the BFO layer 16 transitions from its normally antiferromagnetic state to a ferromagnetic state. When the BFO layer 16 is in the ferromagnetic state, a magnetic exchange bias is created at the interface of the BFO layer 16 and the DMS layer 18 that further enhances, or strengthens, the ferromagnetism of the DMS layer 18. Notably, while BFO is the preferred multiferroic material, the present disclosure is not limited thereto. Other multiferroic materials that exhibit magnetoelectric coupling may alternatively be used to enhance the paramagnetic to ferromagnetic transition of the DMS layer 18.

Figure 2A:
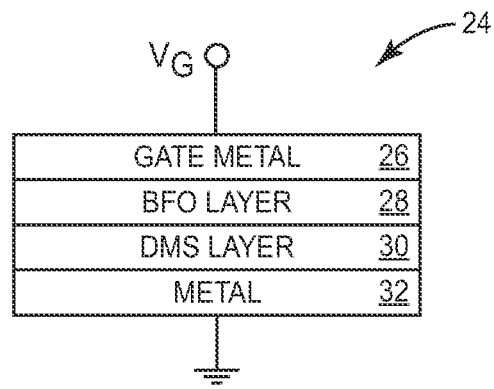
FIGS. 2A through 2F illustrate the operation of the spin transistor of FIG. 1.
Figure 2B:
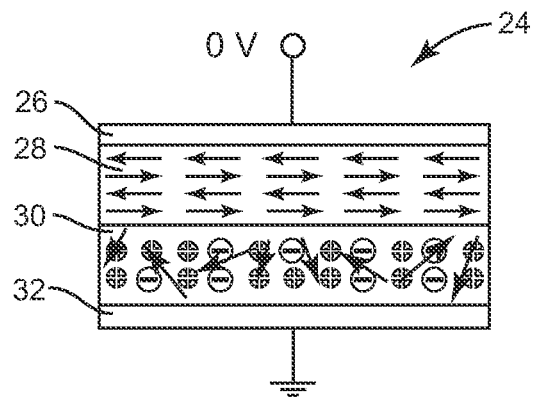
Figure 2C:
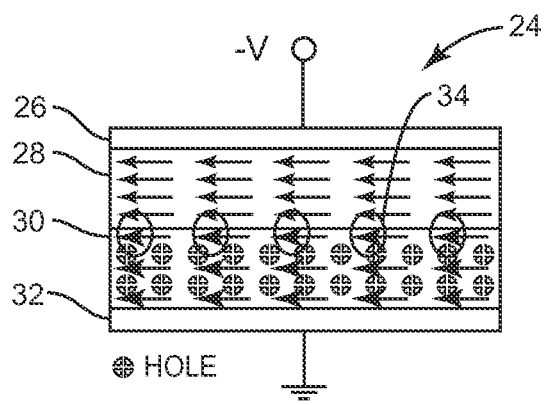
Figure 2D:
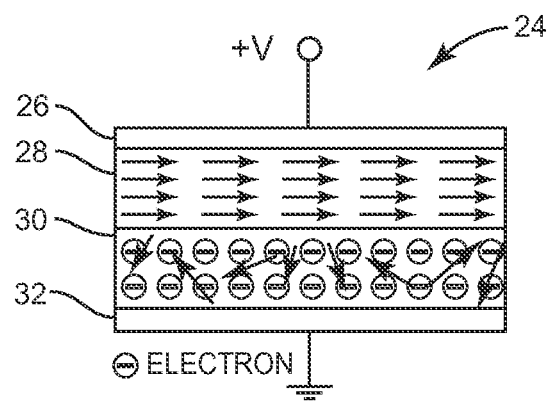
Figure 2E:
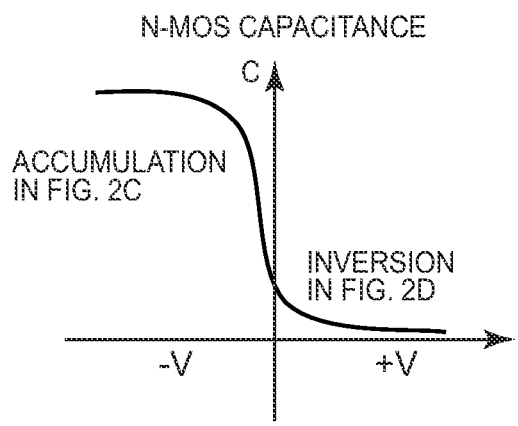

FIGS. 2A through 2F illustrate the operation of the spin transistor 10 of FIG. 1. Specifically, FIG. 2A illustrates a spin capacitor 24, which is the basis of the operation of the spin transistor 10 of FIG. 1. The spin capacitor 24 includes a gate metal 26, a BFO layer 28, a DMS layer 30, and a second metal layer 32 arranged as shown. In this embodiment, the DMS layer 30 is formed of a MnGe nanowire or a MnGe nanodot. As illustrated in FIG. 2B, when a gate voltage of 0 Volts is applied to the gate metal 26, the BFO layer 28 is in an antiferromagnetic state, and the DMS layer 30 is in a paramagnetic state. Notably, the arrows in FIGS. 2B through 2D represent spin states of electrons. Further, as will be appreciated by one of ordinary skill in the art, the spin of an electron is in one of two states, which are commonly referred to as a spin up state and a spin down state.

As illustrated in FIG. 2C, when a sufficiently negative gate voltage is applied to the gate metal 26, the BFO layer 28 transitions from the antiferromagnetic state to a ferromagnetic state. Further, due to the negative gate voltage, the spin capacitor 24 enters an accumulation mode (see FIG. 2E) wherein a large number of holes are accumulated in the DMS layer 30. The holes, which are the carriers in this example, interact with the magnetic ions (e.g., Mg ions) in the DMS layer 30 to cause a carrier-mediated effect whereby the DMS layer 30 transitions from the paramagnetic state to a ferromagnetic state. The transition of the DMS layer 30 from the paramagnetic state to the ferromagnetic state is enhanced by a magnetic exchange bias, or coupling, at the interface of the BFO layer 28 and the DMS layer 30 resulting from the ferromagnetic state of the BFO layer 28. This exchange bias, or coupling, is illustrated in FIG. 2C by reference numeral 34.

As illustrated in FIG. 2D, when a positive gate voltage is applied to the gate metal 26, the BFO layer 28 transitions to a ferromagnetic state. However, due to the positive gate voltage, holes are depleted from the DMS layer 30 such that the spin capacitor 24 enters depletion and inversion modes (see FIG. 2E). As a result, there is an insufficient number of holes in the DMS layer 30 to cause the DMS layer 30 to transition to the ferromagnetic state. As such, the DMS layer 30 remains in its normal state, which in this example is the paramagnetic state.

Figure 2F:
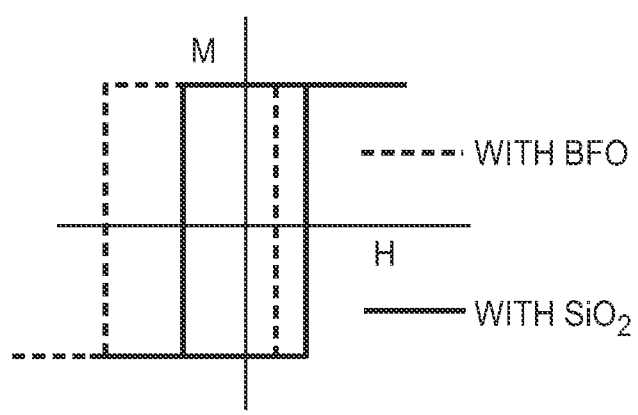

As shown in FIG. 2F, as a result of the magnetic exchange bias, or coupling, at the interface of the BFO layer 28 and the DMS layer 30 when a negative gate voltage is applied to the gate metal 26, the coercivity of the ferromagnetic hysteresis curve widens and shifts position with respect to that of a similar capacitor that uses a conventional dielectric, which in this case in Silicon Dioxide ($SiO_2$). This results in a magnetic exchange bias magnetic field, which means that the strength of the ferromagnetism in the DMS layer 30 is further enhanced by the magnetic exchange bias created at the interface of the BFO layer 28 and the DMS layer 30. This enhancement coupled with nanostructure implementations of the DMS layer 30 enables spin transistors, such as the spin transistor 10, to operate at room temperature (i.e., have a Curie temperature greater than room temperature).

Returning to FIG. 1 and using the preferred embodiment where the DMS layer 18 is MnGe as an example, when a voltage of 0 Volts is applied to the gate metal 14, the BFO layer 16 is in the antiferromagnetic state, and the DMS layer 18 is in the paramagnetic state. Because the DMS layer 18 is in the paramagnetic state, the spin of electrons injected into the source contact 20 is not propagated through the DMS layer 18 and, as such, a logic "0" is read at the drain contact 22 of the spin transistor 10. When a negative turn-on voltage is applied to the gate metal 14, the BFO layer 16 transitions from the antiferromagnetic state to the ferromagnetic state, thereby inducing a magnetic exchange bias at the interface of the BFO layer 16 and the DMS layer 18. In addition, as a result of the negative gate voltage, holes accumulate in the DMS layer 18 such that the DMS layer 18 transitions from the paramagnetic state to the ferromagnetic state. The transition of the DMS layer 18 from the paramagnetic state to the ferromagnetic state is enhanced by the magnetic exchange bias at the interface of the BFO layer 16 and the DMS layer 18. Because the DMS layer 18 is now in the ferromagnetic state, the spin of electrons injected into the source contact 20 is propagated to the drain contact 22 via the DMS layer 18, which is read at the drain contact 22 as a logic "1."

Figure 3:
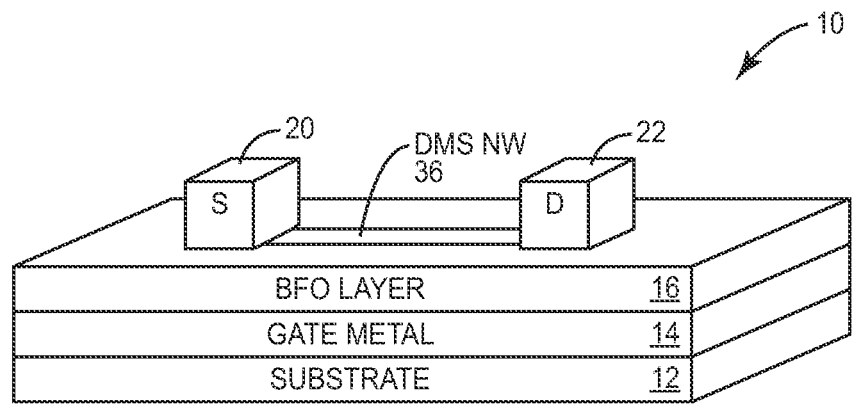
FIG. 3 illustrates an embodiment of the spin transistor of FIG. 1 wherein the DMS layer, or channel, is implemented as a DMS nanowire.

FIG. 3 illustrates an embodiment of the spin transistor 10 wherein the DMS layer 18 (FIG. 1) is implemented as a DMS nanowire 36. In one embodiment, the DMS nanowire 36 has a diameter in the range of and including 10 nanometers (nm) to 100 nm. In another embodiment, the DMS nanowire 36 is essentially a one-dimensional structure having a width in the range of and including 10 nm to 100 nm. While only one DMS nanowire 36 is illustrated, the DMS layer 18 may be implemented as one or more DMS nanowires 36. In the preferred embodiment, the DMS nanowire 36 is a $Mn_xGe_{1-x}$ nanowire. Further, in one embodiment, the $Mn_xGE_{1-x}$ nanowire is synthesized by a Supercritical Fluid-Liquid-Solid (SFLS) growth method using Gold nanoparticles supported on substrates as catalytic seeds for growth. While not essential and understanding, the SFLS growth method is similar to the traditional Vapor-Liquid-Solid (VLS) growth method except that the semiconductor precursor is transported to the catalysts via a fluid phase rather than a gas phase. The $Mn_xGE_{1-x}$ nanowire synthesized using the SFLS growth method are single crystalline in nature with an average Mn concentration between 0.5 and 1.0 wt %. Note, however, that the DMS nanowire 36 may be formed using any suitable technique.

Figure 4:
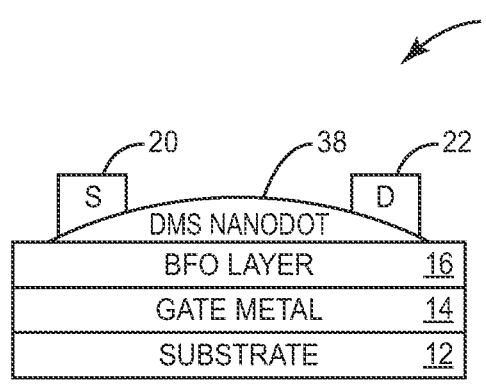
FIG. 4 illustrates another embodiment of the spin transistor of FIG. 1 where the DMS layer, or channel, is implemented as a DMS nanodot.

FIG. 4 illustrates another embodiment of the spin transistor 10 where the DMS layer 18 (FIG. 1) is implemented as a DMS nanodot 38. Preferably, the DMS nanodot 38 is a MnGe nanodot. In one specific embodiment, the DMS nanodot 38 is a $Mn_{0.05}Ge_{0.95}$ nanodot, or quantum dot, grown on a Si substrate by Molecular Beam Epitaxy (MBE). In one embodiment, the DMS nanodot 38 has a base diameter in the range of and including 30 nm to 50 nm and a height in the range of and including 6 nm to 8 nm.

Figure 5:
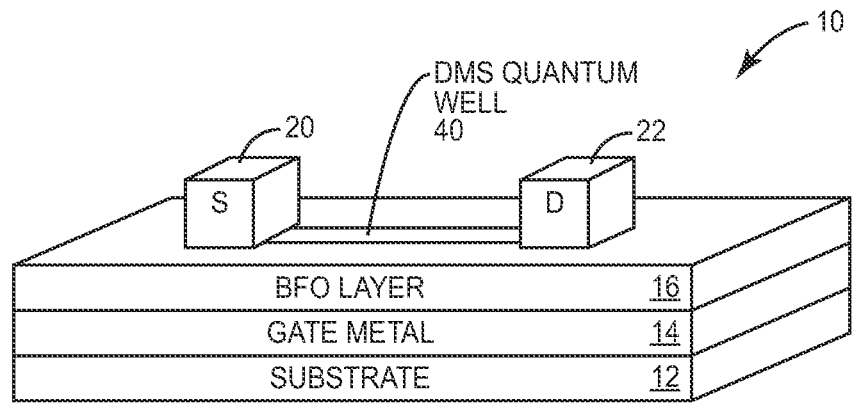
FIG. 5 illustrates another embodiment of the spin transistor of FIG. 1 where the DMS layer, or channel, is implemented as a DMS quantum well.
Figure 6A:
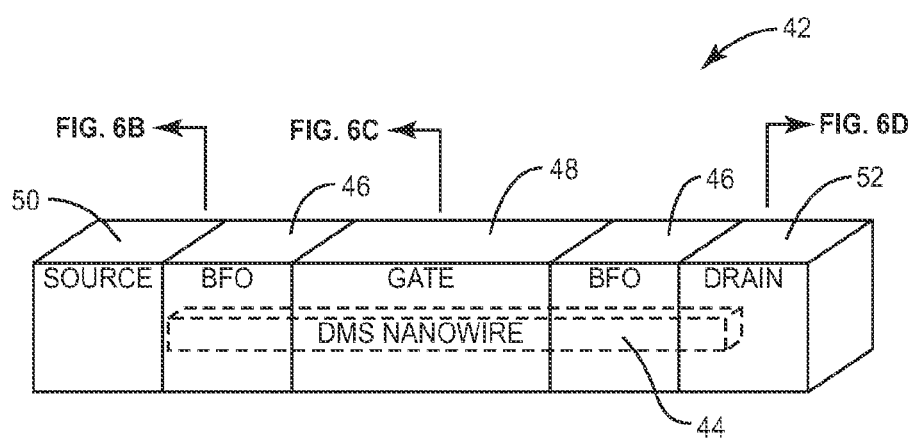
Figure 6D:
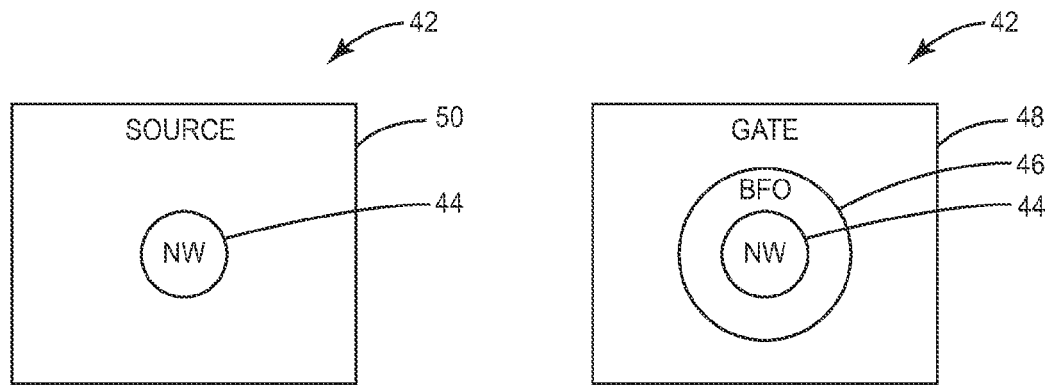
Figure 6D:
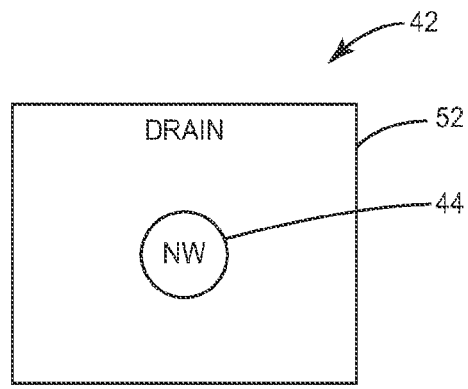

FIG. 5 illustrates another embodiment of the spin transistor 10 where the DMS layer 18 (FIG. 1) is implemented as a DMS quantum well 40. Preferably, the DMS quantum well 40 is formed of MnGe. The DMS quantum well 40 has dimensions on the nanoscale. In one embodiment, the DMS quantum well 40 has a width in that is less than 30 nm (e.g., in a range of and including about 10 nm to 15 nm) and a depth (or height) in a range of and including 6 nm to 8 nm.

FIGS. 6A through 6D illustrate a spin transistor 42 according to another embodiment of the present disclosure. In this embodiment, the spin transistor 42 is a surround gate spin transistor implemented as a core shell nanostructure. More specifically, as illustrated, the spin transistor 42 includes a DMS nanowire 44 surrounded by a BFO shell 46. As discussed above with respect to the BFO layers 16 and 28 of FIGS. 1 and 2A, the BFO shell 46 operates as a gate dielectric. The high dielectric K value of the BFO shell 46 increases the carrier density at the interface of the DMS nanowire 44 and the BFO shell 46 and thus enhances carrier-mediate ferromagnetism inside the DMS nanowire 44. In addition, the BFO shell 46 operates to enhance the paramagnetic to ferromagnetic transition of the DMS nanowire 44 via electrically modulated magnetic exchange bias, or coupling.

In one embodiment, the DMS nanowire 44 has a diameter in the range of and including 10 nm to 100 nm. In the preferred embodiment, the DMS nanowire 44 is a $Mn_xGe_{1-x}$ nanowire. Also, while the shell 46 is formed of BFO in this embodiment, other multiferroics having similar dielectric and magnetoelectric coupling properties may alternatively be used. A gate contact 48 is formed on the BFO shell 46. In this embodiment, the gate contact 48 completely encompasses the BFO shell 46, but is not limited thereto. In an alternative embodiment, the gate contact 48 only partially encompasses the BFO shell 46. In one embodiment, the gate contact 48 is formed of SRO, but is not limited thereto. Source and drain contacts 50 and 52 are formed on the DMS nanowire 44 on opposite sides of the gate contact 48. In this embodiment, the source and drain contacts 50 and 52 completely encompass the BFO shell 46, but are not limited thereto. The source and drain contacts 50 and 52 may alternatively only partially encompass the BFO shell 46. In one embodiment, the source and drain contacts 50 and 52 are formed of Iron, but are not limited thereto.

Those skilled in the art will recognize improvements and modifications to the preferred embodiments of the present disclosure. All such improvements and modifications are considered within the scope of the concepts disclosed herein and the claims that follow.

What is claimed is:

1. A spin transistor comprising:
a dilute magnetic semiconductor channel;
a multiferroic gate dielectric on the dilute magnetic semiconductor channel; and
a gate contact on a surface of the multiferroic gate dielectric opposite the dilute magnetic semiconductor channel.

2. The spin transistor of claim 1 wherein the multiferroic gate dielectric is formed of a multiferroic material that exhibits a cross-coupling between magnetic and electric orders.

3. The spin transistor of claim 1 wherein the multiferroic gate dielectric is formed of BiFeO3.

4. The spin transistor of claim 1 wherein the multiferroic gate dielectric enables electrically modulated magnetic exchange biasing that enhances paramagnetic to ferromagnetic switching of the dilute magnetic semiconductor channel.

5. The spin transistor of claim 1 wherein when a turn-on voltage is applied to the gate contact, the multiferroic gate dielectric transitions from an antiferromagnetic state to a ferromagnetic state to thereby induce a magnetic exchange bias at an interface of the multiferroic gate dielectric and the dilute magnetic semiconductor channel.

6. The spin transistor of claim 5 wherein the magnetic exchange bias enhances a ferromagnetism of the dilute magnetic semiconductor channel.

7. The spin transistor of claim 5 wherein when the turn-on voltage is applied to the gate contact, the dilute magnetic semiconductor channel transitions from a paramagnetic state to a ferromagnetic state.

8. The spin transistor of claim 1 wherein the multiferroic gate dielectric has a dielectric K value that is greater than or equal to 245.

9. The spin transistor of claim 1 wherein the dilute magnetic semiconductor channel is a nanoscale dilute magnetic semiconductor channel.

10. The spin transistor of claim 1 wherein the dilute magnetic semiconductor channel is a dilute magnetic semiconductor nanowire.

11. The spin transistor of claim 10 wherein the dilute magnetic semiconductor nanowire is a Manganese Germanium (MnxGe1-x) nanowire.

12. The spin transistor of claim 10 wherein the dilute magnetic semiconductor nanowire has a diameter in a range of and including 10 nanometers (nm) to 100 nm.

13. The spin transistor of claim 1 wherein the dilute magnetic semiconductor channel is a dilute magnetic semiconductor nanodot.

14. The spin transistor of claim 13 wherein the dilute magnetic semiconductor nanodot is a Manganese Germanium (MnGe) nanodot.

15. The spin transistor of claim 13 wherein the dilute magnetic semiconductor nanodot has a base diameter in a range of and including 30 nanometers (nm) to 50 nm and a height in the range of and including 6 nm to 8 nm.

16. The spin transistor of claim 1 wherein the dilute magnetic semiconductor channel is a dilute magnetic semiconductor quantum well.

17. The spin transistor of claim 16 wherein the dilute magnetic semiconductor quantum well is a Manganese Germanium (MnGe) quantum well.

18. The spin transistor of claim 16 wherein the dilute magnetic semiconductor quantum well has nanoscale dimensions.

19. The spin transistor of claim 1 wherein:
the dilute magnetic semiconductor channel is a dilute magnetic semiconductor nanowire; and
the multiferroic gate dielectric at least partially encompasses the dilute magnetic semiconductor nanowire.

20. The spin transistor of claim 19 wherein the multiferroic gate dielectric completely encompasses the dilute magnetic semiconductor nanowire.

21. The spin transistor of claim 1 wherein the dilute magnetic semiconductor channel is formed of Manganese Germanium (MnGe), and the multiferroic gate dielectric is formed of BiFeO3.

22. The spin transistor of claim 21 wherein the dilute magnetic semiconductor channel is a nanoscale dilute magnetic semiconductor channel.

23. The spin transistor of claim 1 further comprising source and drain contacts on the dilute magnetic semiconductor channel.

* * * * *